(12) United States Patent
Wang et al.

(10) Patent No.: US 9,883,600 B2
(45) Date of Patent: Jan. 30, 2018

(54) DISPLAY DEVICE

(71) Applicant: BOE TECHNOLOGY GROUP CO., LTD., Beijing (CN)

(72) Inventors: Zifeng Wang, Beijing (CN); Yan Ren, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/443,543

(22) PCT Filed: Oct. 31, 2014

(86) PCT No.: PCT/CN2014/090042
§ 371 (c)(1),
(2) Date: May 18, 2015

(87) PCT Pub. No.: WO2015/180410
PCT Pub. Date: Dec. 3, 2015

(65) Prior Publication Data
US 2016/0255730 A1    Sep. 1, 2016

(30) Foreign Application Priority Data

May 29, 2014 (CN) .......................... 2014 1 0236345

(51) Int. Cl.
*G06F 1/16* (2006.01)
*H05K 5/00* (2006.01)
(Continued)

(52) U.S. Cl.
CPC ........... *H05K 5/0017* (2013.01); *F16M 13/00* (2013.01); *G02F 1/1333* (2013.01); *G06F 1/16* (2013.01);
(Continued)

(58) Field of Classification Search
CPC ...... G02F 1/133308; G06F 1/183; G06F 1/16; G06F 1/1601; H05K 7/20345; H05K 5/0017; H05K 5/04
(Continued)

(56) References Cited

U.S. PATENT DOCUMENTS 6,024,335 A * 2/2000 Min ....................... F16M 11/10
248/183.1
6,594,143 B2 * 7/2003 Yano ................. G02F 1/133308
361/679.26
(Continued)

FOREIGN PATENT DOCUMENTS

CN       1780537 A    5/2006
CN       1956026 A    5/2007
(Continued)

OTHER PUBLICATIONS

1st office action issued in Chinese application No. 201410236345.7 dated Oct. 27, 2015.
(Continued)

*Primary Examiner* — Anthony Haughton
(74) *Attorney, Agent, or Firm* — Nath, Goldberg & Meyer; Joshua B. Goldberg

(57) ABSTRACT

The present invention provides a display device, belonging to the field of display device manufacturing technology, which can solve the problem of thick and heavy of the existing display device. The display device of the present invention comprises a display panel, a supporting structure for accommodating and fixing the display panel, and a seat for supporting the supporting structure, wherein the supporting structure is provided with an opening at a side opposite to the seat, and the display panel is allowed to be inserted
(Continued)

into the supporting structure through the opening of the supporting structure. The display device of the present invention is light and thin.

14 Claims, 4 Drawing Sheets

(51) Int. Cl.
| | |
|---|---|
| *H05K 7/00* | (2006.01) |
| *G09F 9/33* | (2006.01) |
| *H05K 1/02* | (2006.01) |
| *H05K 5/04* | (2006.01) |
| *F16M 13/00* | (2006.01) |
| *G02F 1/1333* | (2006.01) |
| *H04N 5/64* | (2006.01) |

(52) U.S. Cl.
CPC ............. *G09F 9/33* (2013.01); *H05K 1/0296* (2013.01); *H05K 5/04* (2013.01); *H04N 5/64* (2013.01); *H05K 2201/10106* (2013.01)

(58) Field of Classification Search
USPC ................. 312/111, 236, 237, 300, 42, 333, 312/223.1–223.3; 257/40, 41; 455/41.2, 455/566, 567, 418, 575.1–575.9; 345/80, 345/1.3, 173, 174, 168, 661, 418, 419, 345/204, 619, 30, 211; 726/19, 28, 21, 726/27, 22, 29, 4; 361/697, 679.46, 361/679.47, 679.53, 679.52, 679.33, 361/679.31, 679.02, 679.48, 679.32, 361/679.58, 679.01, 679.26, 679.59, 361/679.08, 679.09, 679.04–679.07, 361/679.21–679.22, 679.28; 349/56, 57, 349/58, 59, 60
See application file for complete search history.

(56) References Cited

U.S. PATENT DOCUMENTS

| | | | | |
|---|---|---|---|---|
| 6,742,221 | B2* | 6/2004 | Lu | G06F 1/162 |
| | | | | 16/366 |
| 7,903,399 | B2* | 3/2011 | Kim | G02F 1/133308 |
| | | | | 312/223.1 |
| 7,907,391 | B2* | 3/2011 | Park | F16M 11/22 |
| | | | | 361/679.21 |
| 8,142,064 | B2* | 3/2012 | Baek | F16M 11/105 |
| | | | | 348/836 |
| 2002/0047829 | A1 | 4/2002 | Sun et al. | |
| 2002/0135974 | A1* | 9/2002 | Bell | A47G 1/142 |
| | | | | 361/679.41 |
| 2008/0134550 | A1* | 6/2008 | Sun | G06F 1/1601 |
| | | | | 40/491 |
| 2014/0264299 | A1* | 9/2014 | Naijo | H01L 51/0017 |
| | | | | 257/40 |

FOREIGN PATENT DOCUMENTS

| | | |
|---|---|---|
| CN | 203102761 U | 7/2013 |
| CN | 103548431 A | 1/2014 |
| CN | 104050888 A | 9/2014 |
| CN | 203982707 U | 12/2014 |
| JP | 9-127490 | 5/1997 |
| JP | 11-258599 A | 9/1999 |
| JP | 2012156913 A | 8/2012 |

OTHER PUBLICATIONS

International Search Report dated Mar. 4, 2015 issued in International Application No. PCT/CN2014/090042.

* cited by examiner

DISPLAY DEVICE

This is a National Phase Application filed under 35 U.S.C. 371 as a national stage of PCT/CN2014/090042, filed Oct. 31, 2014, an application claiming the benefit of Chinese Application No. 201410236345.7, filed May 29, 2014, the content of each of which is hereby incorporated by reference in its entirety.

FIELD OF THE INVENTION

The present invention relates to fabricating technology of display device, and particularly to a display device.

BACKGROUND OF THE INVENTION

Organic light-emitting diode (OLED) display devices have a broad prospect of application due to the advantages of simple manufacturing process, low cost, high response speed, low power consumption, wide range of operating temperature adaptation, lightness and thinness, easy implementation of flexible display, etc.

The existing LED display device, as shown in FIG. 1, includes a display panel 1, a front frame 2, a back plate 3, a circuit system 5, an electromagnetic shielding cover 6, an outer front case 7, an outer back case 8 and a seat 4. The front frame 2 and the back plate 3 encapsulate and fix the display panel 1 through the frontward and backward clamp or lock; the circuit system 5 is disposed on the back side of the back plate 3 and protected by the electromagnetic shielding cover 6; the outer front case 7 and the outer back case 8 encapsulate and fix the front frame 2, the back plate 3, the display panel 1, the circuit system 5 and the electromagnetic shielding cover 6; and the seat 4 is locked to the outer back case 8 to play a supporting role.

The inventor found that at least the following problems exist in the prior art: in order to support and fix the display panel 1 and provide a protective function, the existing OLED display device includes a front frame 2, a back plate 3, an outer front case 7 and an outer back case 8, but each of the front frame 2, the back plate 3, the outer front case 7 and the outer back case 8 has a certain thickness, thereby being unfavorable for lightness and thinness of the OLED display device; meanwhile, for a large-size OLED display device, its front frame 2 and back plate 3 are difficult to be formed and assembled to some degree, resulting in a high cost.

SUMMARY OF THE INVENTION

A technical problem to be solved by the present invention includes providing a light and thin display device with a simple structure, in view of the above-mentioned problems in the existing display device.

The technical solution adopted for solving the technical problem to be solved by the present invention is a display device, including a display panel, a supporting structure for accommodating and fixing the display panel, and a seat disposed below the supporting structure, wherein the supporting structure is provided with an opening at a side opposite to the seat, and the display panel is allowed to be inserted into the supporting structure through the opening of the supporting structure, and the seat is configured to lock the display panel into the supporting structure.

The display device of the present invention integrates a front frame and a back plate of an existing display device into a whole to form the supporting structure for accommodating and protecting the display panel, without need to clamp and lock the front frame and the back plate. In this case, the integrated supporting structure can achieve the functions of fixing and protecting the display panel, etc., without needing an additional outer front case and outer back case, thus making the display device lighter and thinner.

Preferably, the display panel includes a display surface and a back surface opposite to the display surface; the supporting structure includes a first surface opposite to the display surface of the display panel, and a second surface opposite to the back surface of the display panel; and the first surface is provided with an opening at a position corresponding to a display area of the display surface of the display panel.

Further preferably, the display device further includes a signal plate, the second surface is provided with a first protrusion part at a position close to the seat, and the first protrusion part is configured to accommodate the signal plate.

Preferably, the four corners at the opening of the supporting structure are all rounded corners.

Preferably, the display panel includes a top side surface away from the seat, and two lateral side surfaces connected with the top side surface, and protective adhesive tapes are adhered to the top side surface and the lateral side surfaces.

Preferably, the seat includes a connecting part connected with the supporting structure and a base part for supporting the connecting part, wherein the connecting part and the base part are both of hollow structures.

Further preferably, the base part is made of a metal material.

Still further preferably, the display device further includes a circuit system and a connecting line, wherein the circuit system is disposed in the base part, the connecting line is arranged in the connecting part, and the circuit system is connected with the display panel by the connecting line.

Even further preferably, the connecting part is provided with a second protrusion part at a part connecting with the supporting structure, and a silicone gasket is arranged on the second protrusion part.

Preferably, the connecting part is a U-shaped structure, which is connected to the supporting structure at one side and connected to the base part at the other side, wherein the wall thickness of the U-shaped structure at the side close to the supporting structure is larger than that at the other side.

Preferably, the display device is an OLED display device.

Figure 1:
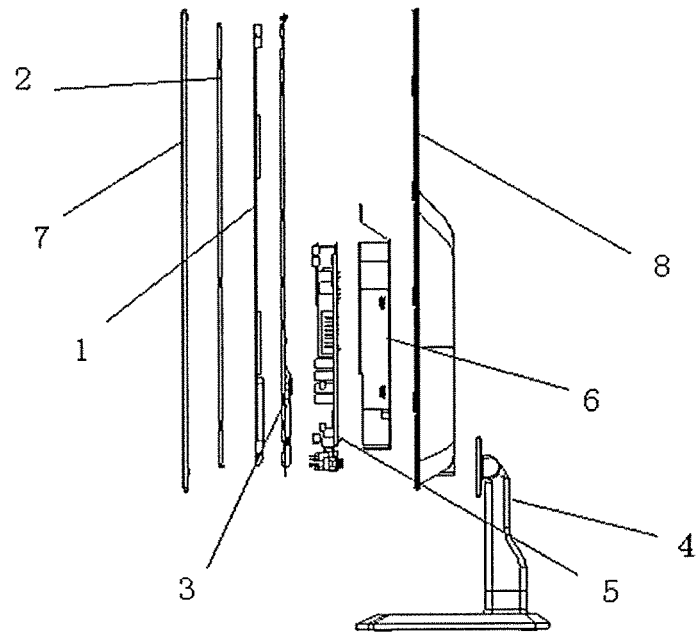
FIG. 1 is a structure diagram of a display device in the prior art.
Figure 2:
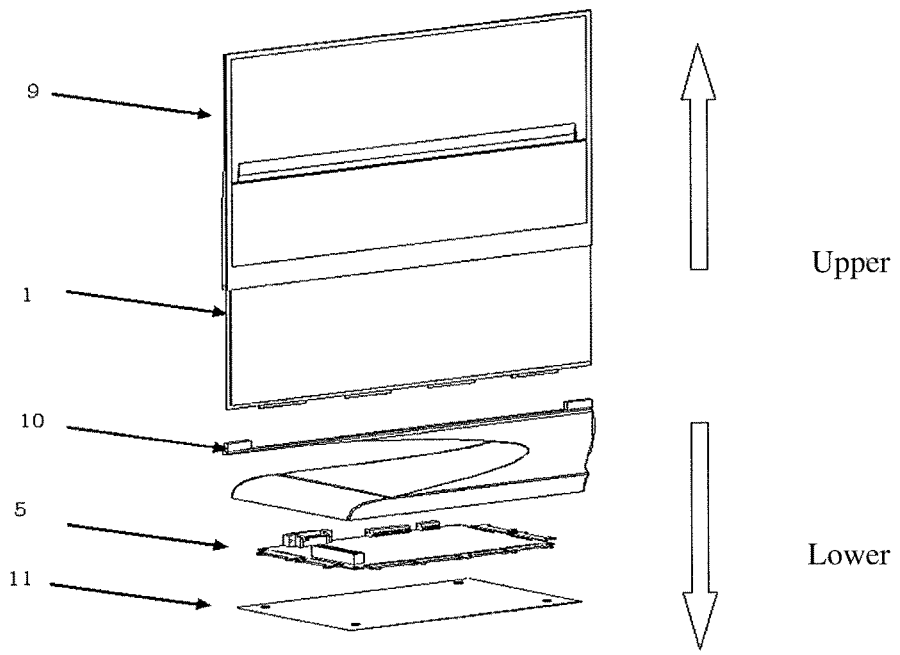
FIG. 2 is a structure diagram of a display device according to a first embodiment of the present invention.

REFERENCE NUMERALS 1. display panel; 2. front frame; 3. back plate; 4. seat; 5. circuit system; 6. electromagnetic shielding cover; 7. outer front case; 8. outer back case; 9. supporting structure; 9-1. first surface; 9-2. second surface; 10. connecting part; 11. base part; 12. first protrusion part; 13. second protrusion part; 14. screw hole; 15. silicone gasket.

DETAILED DESCRIPTION OF THE EMBODIMENTS

To make the person skilled in the art better understand the technical solutions of the present invention, the present invention is further described below in detail in conjunction with the accompanying drawings and the specific embodiments.

First Embodiment

Figure 3:
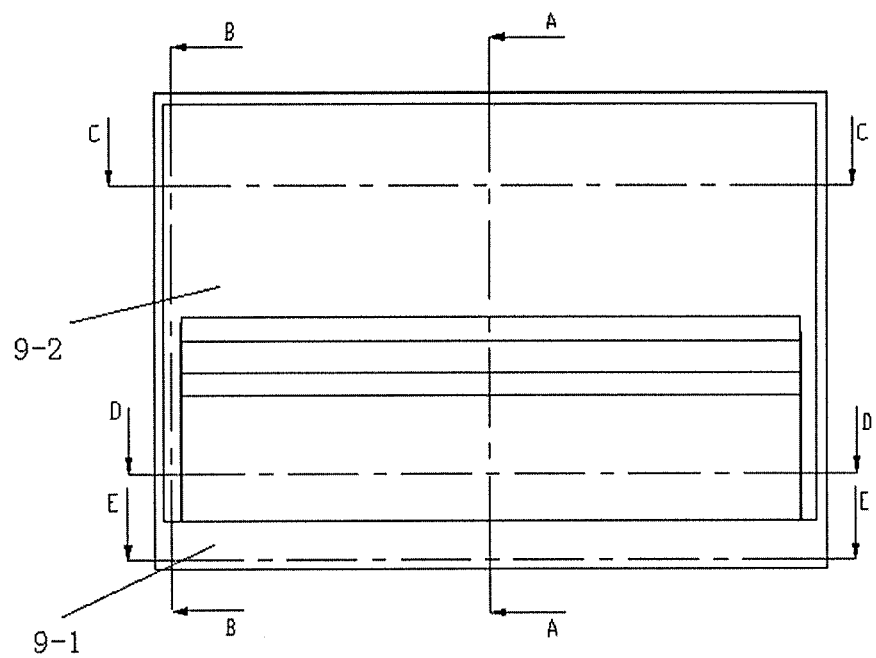
FIG. 3 is a structure diagram of the supporting structure of a display device according to the first embodiment of the present invention.
Figure 4:
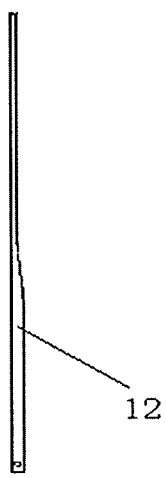
FIG. 4 is a side view of a second surface of the supporting structure of the display device according to the first embodiment of the present invention.

As shown in FIGS. 2-7, the embodiment provides a display device, including a display panel 1, a supporting structure 9 for accommodating and fixing the display panel 1, and a seat 4 disposed below the supporting structure 9, wherein the supporting structure 9 is provided with an opening at a side opposite to the seat 4, and the display panel 1 is allowed to be inserted into the supporting structure 9 through the opening of the supporting structure 9, and the seat 4 is configured to lock the display panel into the supporting structure 9. The A-A section in FIG. 3 is shown for illustrating the opening of the supporting structure 9, from which the display panel is inserted.

The display device of the embodiment integrates a front frame 2 and a back plate 3 of an existing display device into a whole to form the supporting structure 9 for accommodating and protecting the display panel 1, without need to clamp and lock the front frame 2 and the back plate 3. In this case, the integrated supporting structure 9 can achieve the functions of fixing and protecting the display panel 1, etc., without needing additional outer front case 7 and outer back case 8, thus making the display device lighter and thinner.

The display panel 1 of the display device of the embodiment includes a display surface and a back surface opposite to the display surface; as shown in FIG. 3, the supporting structure 9 includes a first surface 9-1 opposite to the display surface of the display panel, and a second surface 9-2 opposite to the back surface of the display panel; and preferably, the first surface 9-1 is provided with an opening at a position corresponding to a display area of the display surface of the display panel. Of course, if the first surface 9-1 is of a transparent structure, the first surface 9-1 does not need an opening.

Preferably, the display device of the embodiment further includes a signal plate 16 (shown in FIG. 4), and the second surface 9-2 is provided with a first protrusion part 12 at a position close to the seat, that is, the first protrusion part 12 is located at the D-D position in FIG. 3, and the first protrusion part 12 is configured to accommodate the signal plate 16.

It needs to be noted that, the upper and lower sides within the supporting structure 9 are not uniform in thickness, but a fixed distance is maintained between the inner surfaces of the first surface 9-1 and the second surface 9-2, thus functioning to support two sides of the display panel 1. The upper portion of the supporting structure 9 can be made very thin, as long as the thickness of the display panel can be received, that is, the C-C position as shown in FIG. 3 is the thinnest position of the whole supporting structure 9.

Preferably, the four corners at the opening of the supporting structure 9 are all rounded corners, that is, as shown in FIG. 3, the bottom feet at the lower ends of D-D and E-E are all rounded corners. In this case, the display panel 1 can be prevented from being scraped during insertion into the supporting structure 9. Of course, also preferably, the display panel 1 includes a top side surface away from the seat 4, and two lateral side surfaces connected with the top side surface, and protective adhesive tapes are adhered to the top side surface and the lateral side surfaces. This can also prevent the display panel 1 from being scraped during insertion into the supporting structure 9.

Figure 5:
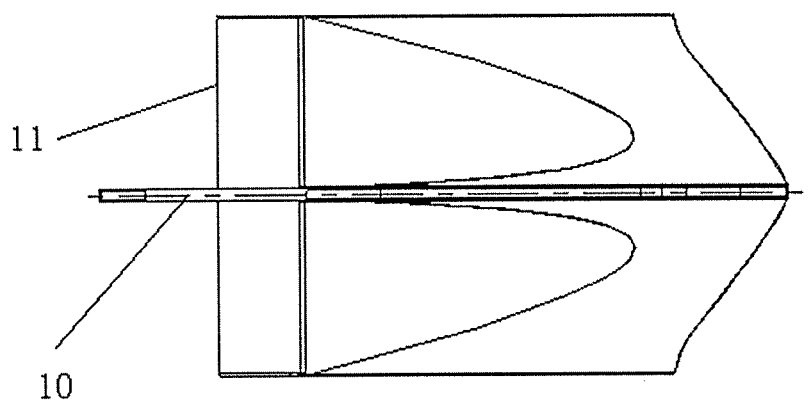
FIG. 5 is a top view of a seat of the display device according to the first embodiment of the present invention.
Figure 6:
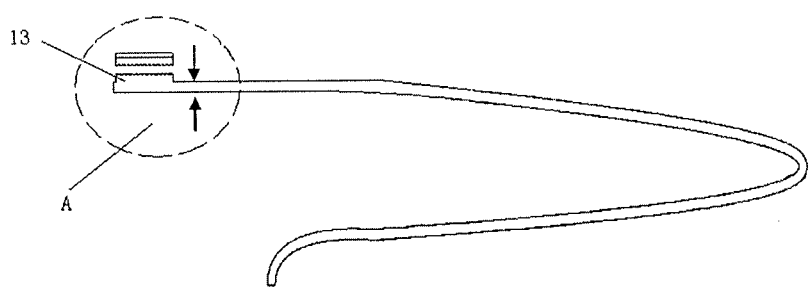
FIG. 6 is a schematic view of a connecting part of the seat of the display device according to the first embodiment of the present invention.
Figure 7:
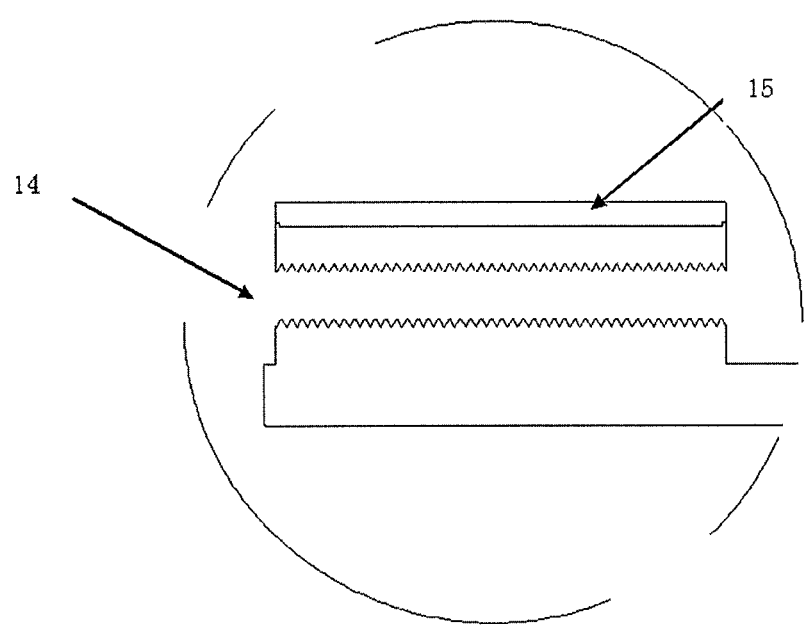
FIG. 7 is a partial enlarged view at A of FIG. 6.

As shown in FIGS. 5-7, preferably, the seat 4 of the embodiment includes a connecting part 10 connected with the supporting structure 9 and a base part 11 for supporting the connecting part 10, wherein the connecting part 10 and the base part 11 are both of hollow structures. Further preferably, the base part 11 is made of a metal material. The display device of the embodiment further includes a circuit system 5 and a connecting line. In this case, further preferably, the circuit system 5 is disposed in the base part 11, and as the base part 11 is made of a metal material, the base part can serve as an electromagnetic shielding cover 6 of the circuit system 5 to prevent external electromagnetic interference. It needs to be noted that, the base part 11 includes a bottom surface and an outer casing, wherein the outer casing and the bottom surface are locked to each other and provided with an accommodating space therebetween, that is, the circuit system 5 is arranged inside the base part 11. The connecting line is arranged in the connecting part 10, and the circuit system 5 is connected with the display panel 1 by the connecting line.

It needs to be noted that, the connecting part 10 and the base part 11 of the seat 4 may be an integrally formed structure, and in this case there is no connecting gap between the connecting part 10 and the base part 11, so the seat 4 with this structure is firmer; of course, the connecting part 10 and the base part 11 of the seat 4 may also be separate structures connected to each other, and in this case the base part 11 can be made of a metal material, and the connecting part 10 is made of a plastic material, wherein the base part 11 of the metal material can serve as an electromagnetic shielding cover 6 of the circuit system 5, and the connecting part 10 of the plastic material not only can make the whole structure of the display device lighter and thinner, but also can save cost.

As shown in FIGS. 6 and 7, in order to better support the display panel 1, preferably, the connecting part 10 is provided with a second protrusion part 13 at a part connecting with the supporting structure 9, and a silicone gasket 15 is arranged on the second protrusion part 13. The second protrusion part 13 is provided with a screw hole 14 at a middle position, and of course the supporting structure 9 is provided with a corresponding round hole at a position corresponding to the second protrusion part 13, so that the connecting part 10 and the supporting structure 9 are locked and fixed to each other through a screw passing through the round hole of the supporting structure and the screw hole 14 of the connecting part.

As shown in FIG. 6, preferably, the connecting part 10 is of a U-shaped structure, wherein the U-shaped structure is connected to the supporting structure at one side and connected to the base part 11 at the other side, and as the side of the U-shaped structure close to the supporting structure 9 is a force bearing side, preferably the wall thickness of the U-shaped structure at the side close to the supporting structure 9 is larger than that at the other side. In this case the thickness of the U-shaped structure is different at the two sides, which not only can ensure supporting ability of the U-shaped structure, but also can make the connecting part 10 lighter and convenient for use.

As an OLED display device does not need a backlight module, and is self-reflective, the display device of the embodiment is preferably an OLED display device, which is lighter and thinner and may have a narrower frame, thus being more practical.

It should be understood that the above embodiments are only exemplary embodiments for illustrating the principle of the present invention, however, the present invention is not limited thereto. Various modifications and improvements may be made by a person skilled in the art without departing from the spirit and essence of the present invention, and these modifications and improvements should also be considered to be within the protection scope of the present invention.

The invention claimed is:

1. A display device, comprising a display panel, and further comprising a supporting structure for accommodating and fixing the display panel, and a seat disposed below the supporting structure, wherein the supporting structure is formed as a single member, and is provided with an opening at a side opposite to the seat, and the display panel is allowed to be inserted into the supporting structure through the opening, and the seat is configured to lock the display panel into the supporting structure.

2. The display device according to claim 1, wherein the display panel includes a display surface and a back surface opposite to the display surface; the supporting structure includes a first surface opposite to the display surface of the display panel, and a second surface opposite to the back surface of the display panel; and the first surface is provided with an opening at a position corresponding to a display area of the display surface of the display panel.

3. The display device according to claim 2, further comprising a signal plate, wherein the second surface is provided with a first protrusion part at a position close to the seat, and the first protrusion part is configured to accommodate the signal plate.

4. The display device according to claim 1, wherein four corners at the opening of the supporting structure are all rounded corners.

5. The display device according to claim 1, wherein the display panel includes a top side surface away from the seat, and two lateral side surfaces connected with the top side surface, and protective adhesive tapes are adhered to the top side surface and the lateral side surfaces.

6. The display device according to claim 1, wherein the seat includes a connecting part connected with the supporting structure and a base part for supporting the connecting part, wherein the connecting part and the base part are both of hollow structures.

7. The display device according to claim 6, wherein the base part is made of a metal material.

8. The display device according to claim 7, further comprising a circuit system and a connecting line, wherein the circuit system is disposed in the base part, the connecting line is arranged in the connecting part, and the circuit system is connected with the display panel by the connecting line.

9. The display device according to claim 8, wherein the connecting part is provided with a second protrusion part at a part connecting with the supporting structure, and a silicone gasket is arranged on the second protrusion part.

10. The display device according to claim 6, wherein the connecting part is a U-shaped structure, which is connected to the supporting structure at one side and connected to the base part at the other side, wherein wall thickness of the U-shaped structure at the side close to the supporting structure is larger than that at the other side.

11. The display device according to claim 7, wherein the connecting part is a U-shaped structure, which is connected to the supporting structure at one side and connected to the base part at the other side, wherein wall thickness of the U-shaped structure at the side close to the supporting structure is larger than that at the other side.

12. The display device according to claim 8, wherein the connecting part is a U-shaped structure, which is connected to the supporting structure at one side and connected to the base part at the other side, wherein wall thickness of the U-shaped structure at the side close to the supporting structure is larger than that at the other side.

13. The display device according to claim 9, wherein the connecting part is a U-shaped structure, which is connected to the supporting structure at one side and connected to the base part at the other side, wherein wall thickness of the U-shaped structure at the side close to the supporting structure is larger than that at the other side.

14. The display device according to claim 1, wherein the display device is an OLED display device.

* * * * *